United States Patent [19]

Miller

[11] Patent Number: 4,668,533

[45] Date of Patent: May 26, 1987

[54] INK JET PRINTING OF PRINTED CIRCUIT BOARDS

[75] Inventor: Joel S. Miller, West Chester, Pa.

[73] Assignee: E. I. Du Pont de Nemours and Company, Wilmington, Del.

[21] Appl. No.: 732,653

[22] Filed: May 10, 1985

[51] Int. Cl.$^4$ .................... C23C 18/28; H05K 3/18
[52] U.S. Cl. ............................. 427/98; 427/436; 427/437; 427/443.1; 427/404; 427/405; 427/304; 427/305; 427/306; 346/75
[58] Field of Search ............. 427/98, 436, 437, 443.1, 427/404, 405, 304–306; 346/75

[56] References Cited

U.S. PATENT DOCUMENTS

| | | | |
|---|---|---|---|
| 3,060,429 | 10/1962 | Winston | 346/1 |
| 3,298,030 | 1/1967 | Lewis et al. | 346/75 |
| 3,373,437 | 3/1968 | Sweet et al. | 346/75 |
| 3,416,153 | 12/1968 | Hertz et al. | 346/75 |
| 3,668,003 | 6/1972 | Furness | 427/306 |
| 3,673,601 | 6/1972 | Hertz | 346/75 |

FOREIGN PATENT DOCUMENTS

| | | | |
|---|---|---|---|
| 0043485 | 1/1982 | European Pat. Off. | 427/98 |
| 3,047,884 | 7/1982 | Fed. Rep. of Germany . | |
| 3326508 | 2/1985 | Fed. Rep. of Germany | 427/98 |
| 56-66089 | 6/1981 | Japan . | |
| 1431462 | 4/1976 | United Kingdom . | |

OTHER PUBLICATIONS

Feldstein "Selective Electroless Plating Techniques: A Survey" Plating, Aug. 1970.
Keeling, *Phys. Technol.* 12:196 (1981).
Kuhn et al., *Scientific American*, Apr. 1979, p. 162.
Vest et al., *Intl. J. Hybrid Microelectronics* 6:261 (1983).
Coombs, *Printed Circuits Handbook* (McGraw-Hill, New York 1979), pp. 7.1–7.9, 22.12–22.13.
Horkans et al., *IBM J. Res. Develop.* 28:690 (1984).

*Primary Examiner*—John D. Smith
*Attorney, Agent, or Firm*—James A. Costello

[57] ABSTRACT

Imagewise deposition of ink onto a substrate such as a circuit board, by ink jet technology, to produce a metal-imaged circuit board.

16 Claims, No Drawings

INK JET PRINTING OF PRINTED CIRCUIT BOARDS

BACKGROUND OF THE INVENTION

1. Field of the Invention

This invention relates to the use of ink jet printing for metal-image formation in an improved process for making printed circuit boards.

2. State of the Art

Ink jet printing is a nonimpact technique for projecting droplets of ink onto a substrate. One typical method employed for standard printing of, say, a page of alphanumeric characters is as follows. A conducting ink is supplied under pressure to an ink gun and forced out through a small nozzle of typically 35 to 80 $\mu$m diameter. As it passes through the nozzle the liquid is piezoelectrically pulsed (or modulated) and the stream breaks up into a continuous series of drops which are equally spaced and of equal size.

Surrounding the jet at the point where the drops separate from the liquid stream in a charge electrode. A voltage is applied between the charge electrode and the drop stream and when a drop breaks off from the stream it therefore carries a charge proportional to the applied voltage at the instant at which it breaks off. By varying the charge electrode voltages at the same rate as drops are produced it is therefore possible to charge every drop to a predetermined level. The drop stream continues its flight and passes between two deflector plates which are maintained at a constant potential, typically ±2.5 kV. In the presence of this field a drop is deflected towards one of the plates by an amount proportional to the charge carried. Drops which are uncharged are undeflected and collected by a gutter to be recycled into the ink gun. Those drops which are charged, and hence deflected, impinge on a substrate traveling at high speed at right angles to the direction of drop deflection. By varying the charge on individual drops, the desired pattern can be printed.

The ink jet process is adaptable to computer control for high speed printing of continuously variable data. Ink jet printing methods can be divided into three general categories: high pressure, low pressure, and vacuum techniques. All have been described and employed in conventional ink jet printing and can be employed in the process of this invention.

Reviews of various aspects of conventional ink jet printing can be found in these publications: Kuhn et al., *Scientific American*, April, 1979, pages 162 to 178; and Keeling, *Phys. Technol.*, 12(5), 196 to 203 (1981). Various ink jet apparatuses are known and can be used in the process of this invention. Typical apparatuses are described in U.S. Pat. No. 3,060,429, U.S. Pat. No. 3,298,030, U.S. Pat. No. 3,373,437, U.S. Pat. No. 3,416,153 and U.S. Pat. No. 3,673,601.

German Patent Specification No. 3,047,884 discloses the preparation of printed circuit boards employing an ink jet printer. If the recording head were heated, metals in liquid form could be sprayed. Also disclosed is the spraying of organometallic solutions such as organocopper compounds directly on the unmetallized circuit board. By means of a subsequent laser beam the conductor pathways can be cured completely.

Vest et al., in Intl. J. Hybrid Microelectronics 6, 261 to 267 (1983), disclose computer controlled ink jet printing of hybrid microelectronic circuits. A ink-jet printer is used with a conductor ink based on metallo-organic compounds in solution. The use of silver neodecanoate as a silver conductor is disclosed, with or without added platinum in the form of platinum amine octoate, to produce a solderable connector. Silver conductor line patterns on glass and alumina substrates were produced, the silver inks decomposed to silver when heated to 250° C.

Japanese Kokai No. 66089/1981 discloses a printed circuit board obtained by ink-jet printing a copper foil on a plastic substrate with an acid-proof ink containing a material such as silicon varnish which solidifies on drying, and etching the undesired portion of the copper foil.

British Patent Specification No. 1,431,462 discloses production of relief images using an ink jet method to modify the solubility properties of a polymer layer such as gelatin by spraying a solution of an appropriate material such as formaldehyde in conformity with the image areas.

Concerning electroless plating and conventional techniques for plating printed circuit boards, see: Coombs, Jr., *Printed Circuits Handbook*, Second Edition, McGraw Hill, New York City (1979), pages 7-1 to 7-9, 22-12 and 22-13; and Horkans et al., IBM J. Res. Develop. (1984) Volume 28, pages 690 to 696.

SUMMARY OF THE INVENTION

This invention concerns an improved process for preparing a printed circuit broad wherein the improvement comprises:

(i) depositing an ink comprising a first metal or metal-containing activator on a substrate in a predetermined pattern by the ink jet process, and (ii) depositing on said substrate, by electroless deposition, a second metal having a reduction potential equal to or more positive than that of the first metal, said second metal depositing in a pattern substantially congruent to that formed in step (i).

Another embodiment of this invention concerns an improved process for preparing a printed circuit board wherein the improvement comprises:

(i) depositing an ink comprising a sensitizer for image sensitization on a substrate in a predetermined pattern by the ink jet process, (ii) treating the sensitized substrate of step (i) with a metal-containing activator which is reduced by the sensitizer, and (iii) depositing on said substrate, by electroless deposition, a metal having a reduction potential equal to or more positive than that of the metal employed in step (ii), said metal depositing in a pattern substantially congruent to that formed in step (ii).

DETAILS OF THE INVENTION

In the application of the ink jet process to the present invention, the ink need not be colored and need not necessarily produce a visible image. Hence, the ink can be any liquid, solution, or suspension capable of being sprayed through the jet to obtain a controlled pattern on a substrate. Images of excellent quality are obtained without the usual photographic exposure and development and without the necessity that the original be optically suitable for copying.

Preferred metals for use as sensitizers in step (i) include tin, e.g., stannous chloride; preferred step (i) metals in the two-step process and preferred activators in the three-step process include palladium, e.g., palladium(II). Preferred metals for use in the final process steps include copper, silver, and gold; copper being most preferred. It is contemplated that copper can be employed in both steps of the two-step process and in steps (ii) and (iii) of the three-step process. Under such circumstances, the copper deposited by ink jet printing acts as an activator for the metal that is deposited by electroless plating, it being appreciated that the plating bath may be one of copper. Palladium(II) salts are also contemplated as activators which upon reduction to palladium(O) serve as catalysts for subsequent deposition of metals having more positive reduction potentials.

The process of this invention can be employed with a wide variety of metal-metal combinations, the second metal being deposited by electroless deposition. The only criteria for selecting metal-metal pairs is that the second have a reduction potential greater than or equal to that of the first metal. Representative reduction potentials of metals and metal containing compounds in the electrochemical series are listed in "CRC Handbook of Chemistry and Physics", CRC Press, Inc., 64th Edition, Boca Raton, Fla., 1983–1984, pages D-156 to D-163.

By "substrate" is meant any natural or synthetic support, preferably one which is capable of existing in a flexible or rigid film or sheet form. The substrate can also be the active integrated circuit. For example, the substrate can be a metal, alloy, metal oxide, alloy oxide, ceramic, glass, paper, polymer, molded polymer, filled polymer or a composite comprising one or more of the above. Preferred are epoxy/glass substrates or flexible films such as polyimide.

The conventional four-step process for making printed circuit boards by electroless copper deposition comprises the steps of (1) image formation; (2) image sensitization; (3) image activation; and (4) electroless copper deposition. The process of the instant invention simplifies that process by eliminating one or more of the first three steps and/or by combining same into one step. Another advantage lies in computer control of one of these steps, e.g., deposition of the sensitizer, using the ink jet process.

The following Examples illustrate the invention. All parts and percentages are by weight and all temperatures are in degrees Celsius unless otherwise noted.

EXAMPLE 1

A commercial ink jet printer and terminal were employed in this Example (Tektronix ® 4695 color ink jet printer and Tektronix 4105 terminal). A specially prepared ink was made by diluting the commercial magenta ink-jet ink with 10 volume percent of a commercial sensitizer solution (Enplate Sensitizer Solution #432; Enthone, Inc.). This ink formulation was filtered through a fine (ASTM 4.5 to 5) porosity glass filter prior to use and introduced into the printer via a syringe. The ink jet printer was used to make an image on the paper substrate, and the modified magenta ink was deposited normally.

A portion of the resulting image was treated with a commercial solution of a palladium(II) salt (Enplate Activator Solution #440, diluted by 50 volume percent with deionized water) for 1 minute to introduce a small amount of palladium metal onto the sensitizer-containing image. Electroless deposition of copper onto the palladium-coated image was achieved using an active copper(II) solution prepared from Enplate 400A:deionized water:Enplate 400B (13.5:60:33.5 by volume). Copper was deposited imagewise in three minutes onto the palladium-coated image.

EXAMPLE 2

Example 1 was repeated except that the electroless copper plating solution was prepared from a mixture of deionized water:Enplate 402A:Enplate 402B (4:3:3 by volume). Plating time in separate experiments were 3 to 10 min, and copper was satisfactorily deposited imagewise.

EXAMPLE 3

This Example demonstrates the elimination of two steps in the conventional electroless deposition of copper by use of a palladium dispersion as an ink. The dispersion was prepared from 1 g of palladium black, 9 mL of deionized water, and 0.05 mL of a commercial tetraalkylammonium hydroxide wetting agent. The mixture was sonified for 10 min and filtered through a 1 $\mu$m Millipore ® filter. The black filtrate which contained palladium metal was used as the ink. The ink jet printer used in Example 1 was employed with the palladium-containing ink to print an image. The resulting images were placed in the electroless copper plating solution of Example 2 for times of 3 to 8 min. Copper plating was observed only on the imagewise pattern.

EXAMPLE 4

This Example demonstrates the use of an ink jet printer to deposit copper directly to form an image. A copper metal-based ink was prepared in the following way. About 20 g of finely divided copper particles were cleaned with 10% hydrochloric acid, and the particles were washed in turn with water (twice), acetone, and petroleum ether. The ink was prepared by mixing 1.0 g of the copper particles, 9 mL of deionized water, and 0.05 mL of a commercial tetraalkylammonium hydroxide wetting agent. Before using, the ink was sonified for 10 min and filtered through a 1 $\mu$m Millipore ® filter. The filtrate was used as the ink. The ink jet printer used in Example 1 was employed with the copper-containing ink to print an image which contained copper particles. The imaging process would be completed by electroless deposition of copper selectively onto the copper-coated image using the electroless copper plating solution of Example 2.

I claim:

1. An improved process for preparing printed circuit board wherein the improvement consists essentially of:
   (i) depositing a water-based ink comprising a first metal on a substrate in a predetermined pattern by the ink jet process, and
   (ii) depositing on said substrate, by electroless deposition, a second metal having a reduction potential equal to or more positive than that of the first metal, said second metal depositing in a pattern substantially congruent to that formed in step (i).

2. An improved process for preparing a printed circuit board wherein the improvement consists essentially of:
   (i) depositing a water-based ink comprising a sensitizer for image sensitization on a substrate in a predetermined pattern by the ink jet process,
   (ii) treating the sensitized substrate of step (i) with a metal which is reduced by the sensitizer, and
   (iii) depositing on said substrate, by electroless deposition, a metal having a reduction potential equal to or more positive than that of the metal employed in step (ii), said metal depositing in a pattern substantially congruent to that formed in step (ii).

3. A process according to claim 1 wherein the metal of step (i) is selected from the group palladium and copper, and the metal of step (ii) is selected from the group copper, silver and gold.

4. A process according to claim 2 wherein the metal of step (i) is tin, the metal of step (ii) is selected from palladium and copper, and the metal of step (iii) is selected from copper, silver, and gold.

5. A process according to claim 3 wherein the metal of step (i) is palladium and the metal of step (ii) is copper.

6. A process according to claim 4 wherein the metal of step (ii) is palladium and the metal of step (iii) is copper.

7. A process according to claim 5 wherein the substrate comprises a polymer.

8. A process according to claim 5 wherein the substrate comprises paper.

9. A process according to claim 5 wherein the substrate comprises a metal.

10. A process according to claim 5 wherein the substrate comprises a ceramic.

11. A process according to claim 5 wherein the substrate comprises glass.

12. A process according to claim 6 wherein the substrate comprises a polymer.

13. A process according to claim 6 wherein the substrate comprises paper.

14. A process according to claim 6 wherein the substrate comprises a metal.

15. A process according to claim 6 wherein the substrate comprises a ceramic.

16. A process according to claim 6 wherein the substrate comprises glass.

* * * * *